United States Patent [19]

Bathaee

[11] Patent Number: 5,293,082
[45] Date of Patent: Mar. 8, 1994

[54] OUTPUT DRIVER FOR REDUCING TRANSIENT NOISE IN INTEGRATED CIRCUITS

[75] Inventor: Mehdi Bathaee, Riverside, Calif.

[73] Assignee: Western Digital Corporation, Irvine, Calif.

[21] Appl. No.: 71,598

[22] Filed: Jun. 4, 1993

Related U.S. Application Data

[63] Continuation of Ser. No. 895,251, Jun. 8, 1992, abandoned, which is a continuation of Ser. No. 710,246, Jun. 3, 1991, abandoned, which is a continuation of Ser. No. 209,648, Jun. 21, 1988, abandoned.

[51] Int. Cl.$^5$ .......................... H03K 4/26; H03K 5/01; H03K 17/16
[52] U.S. Cl. .................................. 307/270; 307/443; 307/263; 307/451; 307/572; 307/585
[58] Field of Search ............... 307/443, 451, 572, 585, 307/263, 542, 270, 491, 576, 246, 571, 475

[56] References Cited

U.S. PATENT DOCUMENTS

| | | | |
|---|---|---|---|
| 4,612,466 | 9/1986 | Stewart | 307/443 |
| 4,638,187 | 1/1987 | Boler et al. | 307/443 |
| 4,707,625 | 11/1987 | Yanagisawa | 307/443 |
| 4,725,747 | 2/1988 | Stein et al. | 307/451 |
| 4,777,389 | 10/1988 | Wa et al. | 307/443 |
| 4,785,201 | 11/1988 | Martinez | 307/443 |
| 4,785,203 | 11/1988 | Nakamura | 307/443 |
| 4,789,796 | 12/1988 | Foss | 307/443 |
| 4,818,901 | 4/1989 | Young et al. | 307/263 |
| 4,859,870 | 8/1989 | Wong et al. | 307/264 |

Primary Examiner—Timothy P. Callahan
Attorney, Agent, or Firm—Christie, Parker & Hale

[57] ABSTRACT

A capacitive load is charged and/or discharged in sequential current steps, thereby rapidly changing the charge on the capacitive load. The stepwise change in load current can be effected by a plurality of parallel output driver stages each of which is much smaller, and thus generates less noise, than a single output driver stage with the same overall current carrying capacity. The output driver stages are connected to the load so as to be sequentially actuated responsive to an input signal representative of the binary state to be coupled by the output drive to the load. The input signal is connected to the respective output driver stages by predriver stages. Except for the lowest order predriver stage, each predriver stage has an enable circuit that switches on the driver stage at the desired point in the transition interval between binary states.

12 Claims, 5 Drawing Sheets

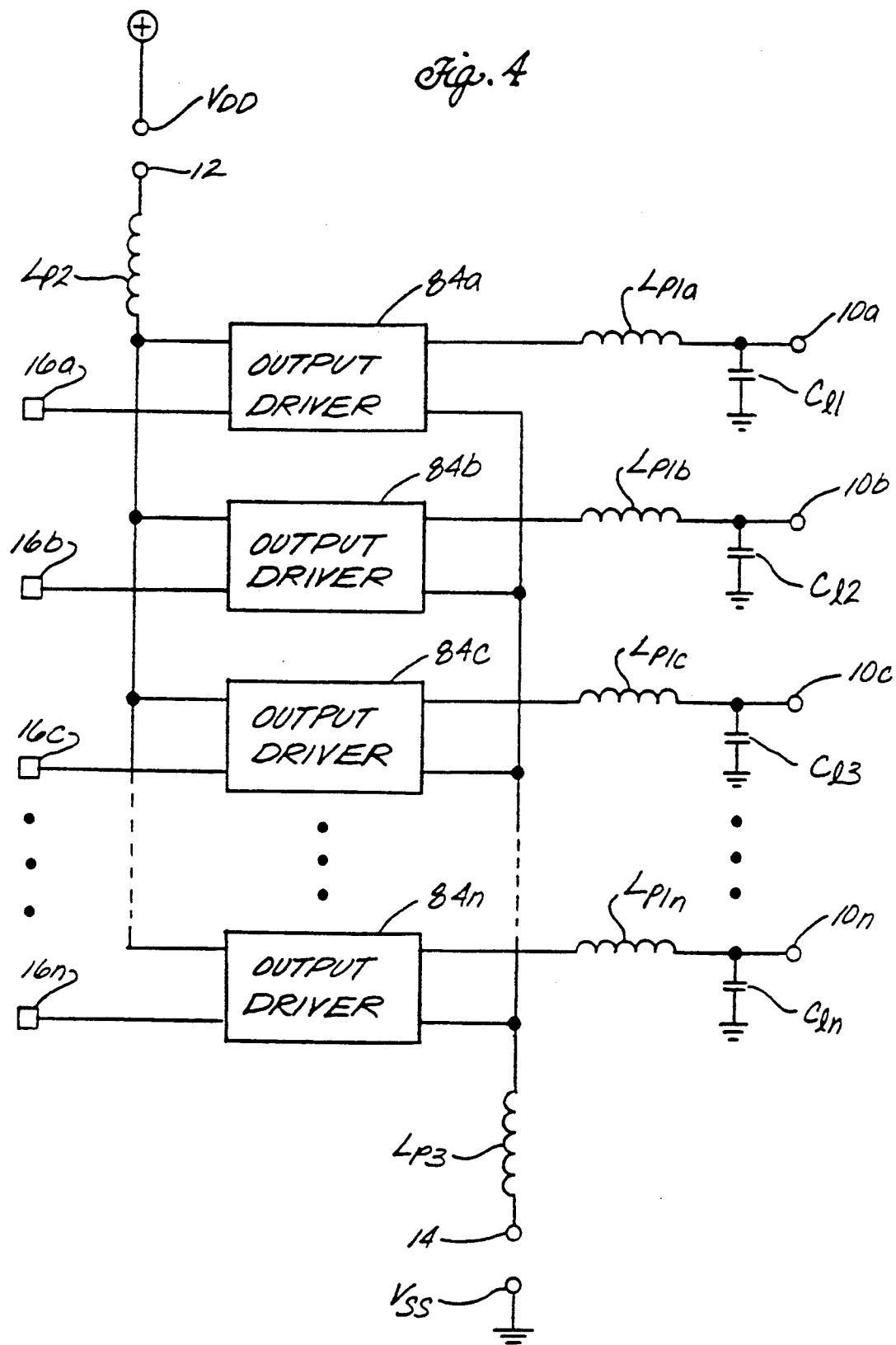

OUTPUT DRIVER FOR REDUCING TRANSIENT NOISE IN INTEGRATED CIRCUITS

CROSS-REFERENCE TO RELATED APPLICATIONS

This application is a continuation of Ser. No. 07/895,251, filed Jun. 8, 1992, which is a continuation of Ser. No. 07/710,246, filed Jun. 3, 1991, which is a continuation of Ser. No. 07/209,648, filed Jun. 21, 1988, all of which are now abandoned.

BACKGROUND OF THE INVENTION

This invention relates to noise reduction in integrated circuits and, more particularly, to a method and apparatus for reducing the transient noise generated during operation of the output drivers of an integrated circuit.

Digital data processing systems are typically built from integrated circuits that incorporate on a single chip thousands of binary circuit elements such as registers, logic gates and input receiver and output driver circuits. Generally, an integrated circuit chip processes a number of parallel channels of data, e.g. eight, sixteen or thirty-two. The integrated circuits are mounted on printed circuit boards having conductive paths that interconnect the input and output circuits on the integrated circuit chips and supply thereto operating power supply potentials. An integrated circuit chip is conventionally incorporated into a package that has a number of leads connecting the integrated circuits on the chip to the printed circuit board. Since the output driver channels of an integrated circuit chip are connected through the package leads "off chip" to the conductive paths on the printed circuit board, they must be designed to drive a large capacitive load, e.g., 50 to 100 pf.

An integrated circuit chip has parasitic inductance representative of the inductance of the conductive paths from the integrated circuit chip to the output pins of its package. It is common practice in the design of integrated circuit chips to employ a single package pin for the connections of all or many of the parallel channels to the power supply potentials off chip. In such case, the output drivers of all the channels driven toward a power supply potential during any single switching interval contribute to the transient noise due to package inductance.

During the past several years, there has been increasing awareness of the problems resulting from the transient noise generated within large scale integrated (LSI) circuits. The major problems occur from the simultaneous switching of multiply output drivers designed to drive high capacitance loads, such as the data bus of microprocessors or the address bus of a large memory array. Under most conditions, the transient current at power supply nodes resulting from switching multiple output drivers, tends to be additive. Therefore, even a small value of parasitic inductance produces series noise problems.

The problem has become more acute and apparent, because evolving technology tends to produce LSI circuits with higher performance. By decreasing the delay of the output driver, by increasing the effective data rate on the outputs, or by increasing the specified load capacitance, then, more electric charge must be transferred in a shorter interval of time.

In application Ser. No. 07/161,469, now U.S. Pat. No. 4,947,063 filed Feb. 26, 1988, by Timothy G. O'Shannesy et al. and assigned to the assignee of the present application, transient noise is reduced by employing a predriver stage that applies an approximately linear ramp shaped control voltage to the gate of a MOS transistor output driver stage during the entire transition interval between binary states. This tends to minimize the rate of change of the load current during the transition interval and therefore the transient noise created by the parasitic inductance.

SUMMARY OF THE INVENTION

According to the invention, a capacitive load is charged and/or discharged in sequential current steps, thereby rapidly changing the charge on the capacitive load. The step wise change in load current can be effected by a plurality of parallel output driver stages each of which is much smaller, and thus generates less noise, than a single output driver stage with the same overall 11 current carrying capacity. The output driver stages are connected to the load so as to be sequentially actuated responsive to an input signal representative of the binary state to be coupled by the output drive to the load. The input signal is connected to the respective output driver stages by predriver stages. Except for the lowest order predriver stage, each predriver stage has an enable circuit that switches on the driver stage at the desired point in the transition interval between binary states responsive to a triggering circuit.

BRIEF DESCRIPTION OF THE DRAWINGS

The features of specific embodiments of the best mode contemplated of carrying out the invention are illustrated in the drawings, in which:

FIG. 4 is a schematic diagram of a plurality of output drivers incorporating principles of the invention as are incorporated in an integrated circuit.

DETAILED DESCRIPTION OF THE SPECIFIC EMBODIMENTS

Figure 1:
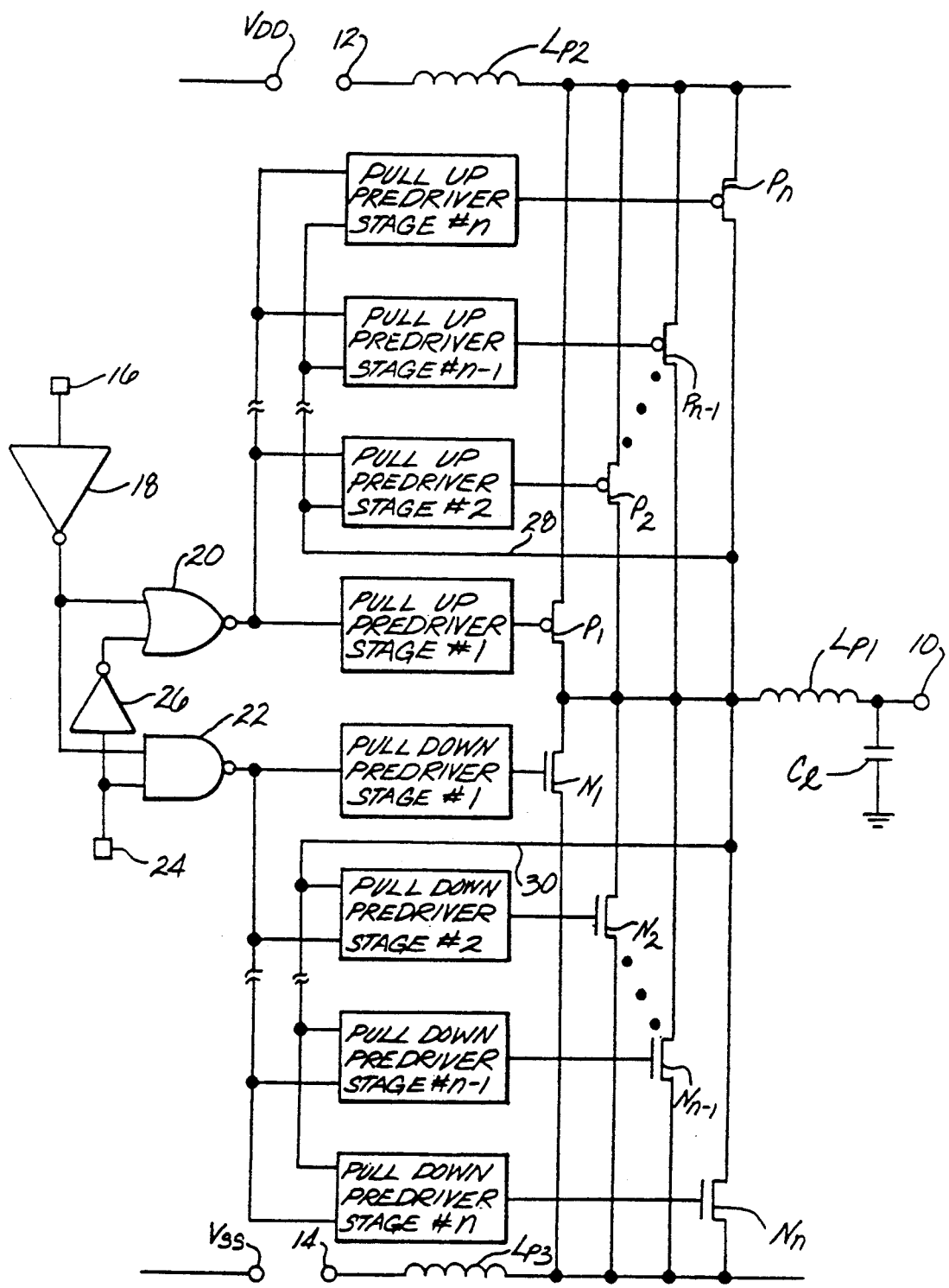
FIG. 1 is a schematic, partially block diagram of an output driver incorporating principles of the invention.

In FIG. 1, one of the plurality of parallel binary data channels on an integrated circuit chip has an output driver comprising D load charging, p-channel, MOS transistor driver stages $P_1, P_2, \ldots P_{n-1}, P_n$ connected in parallel and n load discharging, n-channel, MOS transistor driver stages $N_1, N_2, \ldots N_{n-1}, N_n$ connected in parallel. The drains of transistors $P_1, P_2, \ldots P_{n-1}, P_n$, $N_1, N_2, \ldots N_{n-1}, N_n$, are all connected by a conductive path having a parasitic inductance $L_{p1}$ to a signal output pin 10 of the integrated circuit. A capacitive load $C_l$, which could be a strip line conductor on a printed circuit board leading to another integrated circuit chip, is connected between pin 10 and the system ground external to the integrated circuit on which the described output driver is resident. The sources of transistor $P_1$, $P_2, \ldots P_{n-1}, P_n$ are all connected by a conductive path having a parasitic inductance $L_{p2}$ to a pin 12 of the integrated circuit to which a system power supply potential external to the integrated circuit is coupled. Typically, a power supply bus $V_{DD}$ at plus five volts is connected to pin 12. The sources of transistors $N_1, N_2,$ ... $N_{n-1}$, $N_n$ are all connected by a conductive path having a parasitic inductance $L_{p3}$ to a pin 14 of the integrated circuit to which a system power supply potential external to the integrated circuit is coupled. Typically, a power supply bus $V_{SS}$ at ground potential is connected to pin 14.

A binary data input terminal 16 is coupled by an inverter 18 to one input of a NOR gate 20 and to one input of a NAND gate 22. An enable terminal 24 is directly connected to the other input of NAND gate 22 and connected by an inverter 26 to the other input of NOR gate 20. The logic of NOR gate 20 and NAND gate 22 and inverters 18 and 26 is tri-state. When a high binary signal is applied to enable terminal 24 and a high binary signal is applied to input terminal 16, the outputs of NOR gate 20 and NAND gate 22 are high. When a high binary signal is applied to enable terminal 24 and a low binary signal is applied to input terminal 16, the outputs of NOR gate 20 and NAND gate 22 are low. When a low binary signal is applied to enable terminal 24, the output of NOR gate 20 is low and the output of NAND gate 22 is high, irrespective of the binary value of the signal applied to input terminal 16. In summary, when an enable signal is applied to terminal 24, the binary value, i.e., state, of the signal at input terminal 16 is transferred to the outputs of NOR gate 20 and NAND gate 22 to actuate the described output driver. This is a non-inverting output buffer. By removing inverter 18, it can be converted to an inverting output buffer.

The output of NOR gate 20 is coupled by a pull-up predriver stage #1 to the gate of transistor $P_1$, by a pull-up predriver stage #2 to the gate of transistor $P_2$, . . . by a pull-up predriver stage #n−1 to the gate of transistor $P_{n-1}$, and by a pull-up predriver stage #n to the gate of transistor $P_n$. Similarly, the output of NAND gate 22 is connected by a pull-down predriver stage #1 to the gate of transistor $N_1$, by a pull-down predriver stage #2 to the gate of transistor $N_2$, . . . by a pull-down predriver stage #n−1 to the gate of transistor $N_{n-1}$, and by a pull-down predriver stage #n to the gate of transistor $N_n$. A feedback connection 28 is established between the drains of the driver stages and pull-up stages #2, . . . #n−1, and #n. A feedback connection 30 is established between the drains of the driver stages and pull-down predriver stages #2, . . . #n−1, and #n.

When the data signal on input terminal 16 transitions from low to high, pull-up predriver stage #1 immediately begins to pull-up the voltage at output pin 10 by turning on transistor $P_1$ to supply charging current from power supply bus $V_{DD}$ through transistor $P_1$ to load capacitor $C_1$. Thereafter, as the voltage across output terminal 10 increases during this transition interval, pull-up predriver stages #1, . . . #n−1, and #n are successively enabled, as the voltage across output terminal 10 is sensed by feedback connection 28 to pull up successively transistors $P_2$, . . . $P_{n-1}$, and $P_n$, respectively. When the data signal on input terminal 16 transitions from high to low, pull-down predriver stage #1 immediately begins to pull-down the voltage at output terminal 10 by turning on transistor $N_1$, to discharge current from load capacitor $C_1$ through transistor $P_1$ to power supply bus $V_{SS}$. Thereafter, as the voltage across output terminal 10 decreases during this transition interval, pull-down predriver stages #2, . . . #n−1, and #n are successively enabled as the voltage across output terminal 10 is sensed by feedback connection 30 to pull-down successively transistors $N_2$, . . . $N_{n-1}$, and $N_n$, respectively. Preferably, each predriver stage in succession is enabled when the previous driver stage reaches its saturation current, i.e., pull-up predriver stage #2 is enabled when transistor $P_1$ reaches its saturation current and pull-up predriver stage #n becomes enabled when transistor $P_{n-1}$ reaches its saturation current. By using a plurality of driver stages that are individually smaller, e.g. of the order of 50 to 60 microns compared to 200 to 600 microns in the prior art, the described output driver can switch states in a shorter transition interval without generating more transient noise.

The described driver stages and their predrivers can be viewed as variable charging resistors connected in parallel between the power supply busses and the capacitive load, switched in sequentially during the transition interval to reduce the resultant resistance and thus increase the charging or discharging current until the load has transitioned from one binary value to the other. Each time one of the transistor driver stages saturates, another transistor driver stage turns on to place another effective low resistance in parallel with the saturated driver.

Figure 2:
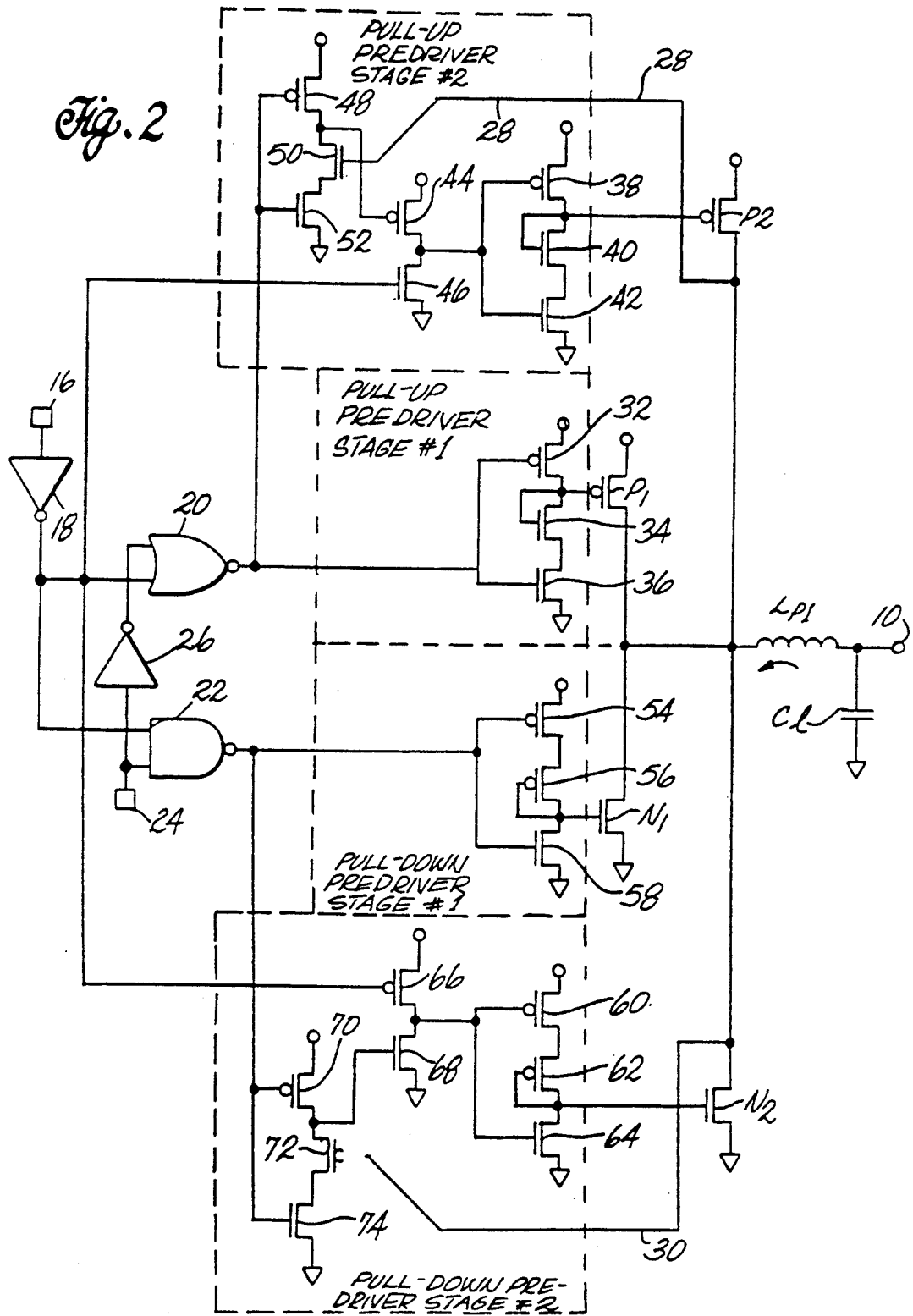
FIG. 2 is a schematic circuit diagram of the output driver of FIG. 1 showing the construction of the predriver stages for a two step implementation.

In FIG. 2 the pull-up and pull-down predriver stages of FIG. 1 are shown in more detail. Components in common with FIG. 1 bear the same reference symbols. Power supply busses $V_{DD}$ and $V_{SS}$ are not shown. Instead, terminals are connected to the sources of the p-channel transistors to represent application of bias from power supply bus $V_{DD}$ and arrows are connected to the sources of the n-channel transistors to represent application of bias from power supply bus $V_{SS}$. Pull-up predriver stage #1 comprises a p-channel MOS transistor 32, an n-channel MOS transistor 34, an n-channel MOS transistor 36. The source of transistor 32 is connected to power supply bus $V_{DD}$, the drain of transistor 32 is connected to the drain of transistor 34, the source of transistor 34 is connected to the drain of transistor 36, and the source of transistor 36 is connected to power supply bus $V_{SS}$. The output of NOR gate 20 is connected to the gates of transistors 32 and 36. The drain of transistor 34 is connected to its gate to operate transistor 34 in saturation when it is turned on. The drain and gate of transistor 34 are also connected to the gate of transistor $P_1$. When the signal at the output of NOR gate 20 is low, transistor 32 is ON, transistors 34 and 36 are OFF, the gate of transistor $P_1$ is high and transistor $P_1$ is OFF. As the output of NOR gate 20 goes high, transistor 32 turns OFF, transistors 34 and 36 turn ON, the gate of transistor $P_1$ goes low and transistor $P_1$ turns ON to connect power supply bus $V_{DD}$ to load $C_1$ through transistor $P_1$. Because transistor 34 is saturated, the gate of transistor $P_1$ is clamped at a voltage level above that of power supply bus $V_{SS}$ by an amount equal to the voltage threshold of transistor 34, i.e., approximately one volt. This limits the change of current through transistor $P_1$. Transistor 34 also serves to isolate, i.e., filter noise on, power supply bus $V_{SS}$ from the gate of transistor $P_1$ by virtue of its drain-to-gate connection, which causes the drain of transistor 34 to be clamped one threshold above bus $V_{SS}$.

Pull-up predriver stage #2 has a p-channel MOS transistor 38, an n-channel MOS transistor 40 and an n-channel MOS transistor 42 that are connected and function as transistor 32, 34 and 36 described above. In addition, pull up predriver stage #2 has an enabling circuit comprising a p-channel MOS transistor 48 and n-channel MOS transistors 46 and 52 and an output voltage sensing circuit comprising a p-channel MOS transistor 44, and an n-channel MOS transistor 50. The source of transistor 44 is connected to power supply bus $V_{DD}$, the drain of transistor 44 is connected to the drain of transistor 46 and the source of transistor 46 is connected to power supply bus $V_{SS}$. The drains of transistors 44 and 46 are also connected to the gates of transistors 38 and 42. The output of inverter 18 is connected the gate of transistor 46. The source of transistor 48 is connected to power supply bus $V_{DD}$, the drain of transistor 48 is connected to the drain of transistor 50, the source of transistor 50 is connected to the drain of transistor 52, and the source of transistor 52 is connected to power supply bus $V_{SS}$. The drain of transistor $P_2$ is coupled by feedback connection 28 to the gate of transistor 50. The output of NOR gate 20 is connected to the gates of transistors 48 and 52. The drains of transistors 48 and 50 are connected to the gate of transistor 44. The output voltage sensing circuit performs a threshold sensing function. When the signal at the output of NOR gate 20 is low, transistor 48 is ON, transistors 50 and 52 are OFF, transistor 44 is OFF, and transistor 46 is ON. The W/L ratio of transistor 50 is designed so its sensing threshold voltage equals the voltage at the drains of the output driver stages at which pull-up predriver stage #2 is to be enabled. Thus, as the output of NOR gate 20 goes high, transistor 46 turns OFF, transistor 48 turns OFF, transistor 52 turns ON, and after the threshold voltage of transistor 50 is reached at the drains of the output driver stages, transistor 50 turns ON. As a result, transistor 44 turns ON to enable pull-up predriver state #2 and the gates of transistors 38 and 42 go high to turn transistor $P_2$ ON.

The remaining pull-up predriver stages are identical to pull-up predriver stage #2, except for the W/L ratio of the transistor corresponding to transistor 50.

Pull-down predriver stage #1 comprises a p-channel MOS transistor 54, a p-channel MOS transistor 56, and an n-channel MOS transistor 58. The source of transistor 54 is connected to power supply bus $V_{DD}$, the drain of transistor 54 is connected to the source of transistor 56, the drain of transistor 56 is connected to the drain of transistor 58, and the source of transistor 58 is connected to power supply bus $V_{SS}$. The output of NAND gate 22 is connected to the gates of transistors 54 and 58. The source of transistor 56 is connected to its gate to operate transistor 56 in saturation when it is turned ON. The drain and gate of transistor 56 are also connected to the gate of transistor $N_1$. When the signal at the output of NAND gate 22 is high, transistors 54 and 56 are OFF, transistor 58 is ON, the gate of transistor $N_1$ is low and transistor $N_1$ is OFF. Thus, load $C_1$ is high. As the output of NAND gate 22 goes low, transistors 54 and 56 turn ON, transistor 58 turns OFF, the gate of transistor $N_1$ goes high, and transistor $N_1$ turns ON to connect power supply bus $V_{SS}$ to load $C_1$ through transistor $N_1$. Because transistor 56 is saturated, the gate of transistor $N_1$ is clamped at a voltage level below power supply bus $V_{DD}$ by an amount equal to the voltage threshold of transistor 56, i.e., approximately one volt. This limits the change of current through transistor $N_1$. Transistor 56 also serves to isolate, i.e., filter noise on, power supply bus $V_{DD}$ from the gate of transistor $N_1$ by virtue of its drain-to-gate connection, which causes the drain of transistor 34 to be clamped one threshold below bus $V_{DD}$.

Pull-down predriver stage #2 has a p-channel MOS transistor 60, a p-channel MOS transistor 62, and an n-channel MOS transistor 64 that are connected and function as transistor 54, 56, and 58 described above. In addition, pull-down predriver stage #2 has an enabling circuit comprising a p-channel MOS transistor 66 and an n-channel MOS transistor 68 and an output voltage sensing circuit comprising a p-channel MOS transistor 70, a p-channel MOS transistor 72 and an n-channel MOS transistor 74. The source of transistor 66 is connected to power supply bus $V_{DD}$, the drain of transistor 66 is connected to the drain of transistor 68, and the source of transistor 68 is connected to power supply bus $V_{SS}$. The drains of transistors 66 and 68 are also connected to the gates of transistors 60 and 64. The output of inverter 18 is connected the gate of transistor 66. The source of transistor 70 is connected to power supply bus $V_{DD}$, the drain of transistor 70 is connected to the source of transistor 72, the drain of transistor 72 is connected to the drain of transistor 74, and the source of transistor 74 is connected to power supply bus $V_{SS}$. The drain of transistor $N_2$ is coupled by feedback connection 30 to the gate of transistor 72. The output of NAND gate 22 is connected to the gates of transistors 70 and 74. The drains of transistors 72 and 74 are connected to the gate of transistor 68. The enabling circuit performs a logical NOR function. The output voltage sensing circuit performs a logical NAND function. When the signal at the output of NAND gate 22 is high, transistor 74 is ON, transistors 70 and 72 are OFF, transistor 68 is OFF, and transistor 66 is ON. The W/L ratio of transistor 72 is designed so its threshold voltage equals the voltage at the drains of the output driver stages at which pull-down predriver stage #2 is to be enabled. Thus, as the output of NAND gate 22 goes low, transistor 66 turns OFF, transistor 74 turns OFF, transistor 70 turns ON, and after the threshold voltage of transistor 72 is reached at the drains of the output driver stages, transistor 72 turns ON. As a result, transistor 68 turns ON to enable pull-down predriver stage #2 and the gates of transistors 38 and 42 go low to turn transistor $N_2$ ON.

The remaining pull-down predriver stages are identical to pull-down predriver stage #2, except for the W/L ratio of the transistor corresponding to transistor 72.

Figure 3A:
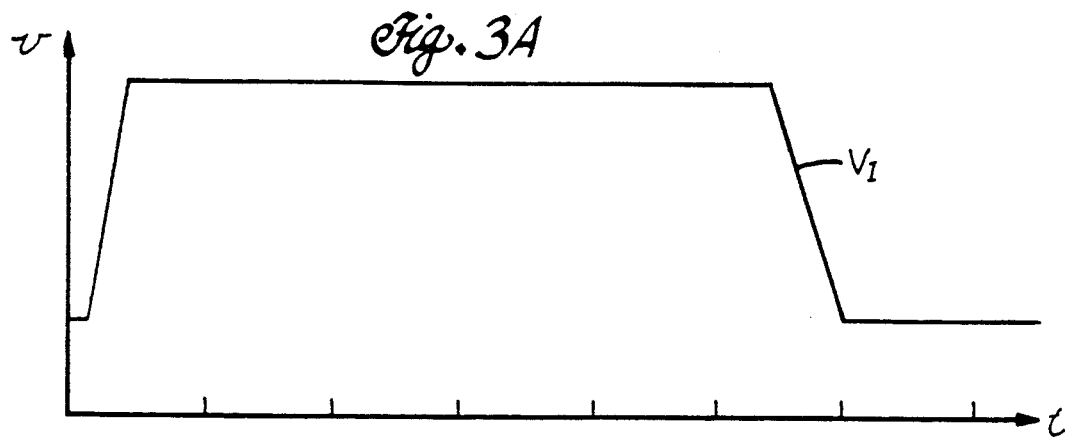
FIG. 3A to FIG. 3F are waveform diagrams illustrating typical voltage and current values of the output driver of FIG. 2 as a function of time.
Figure 3B:
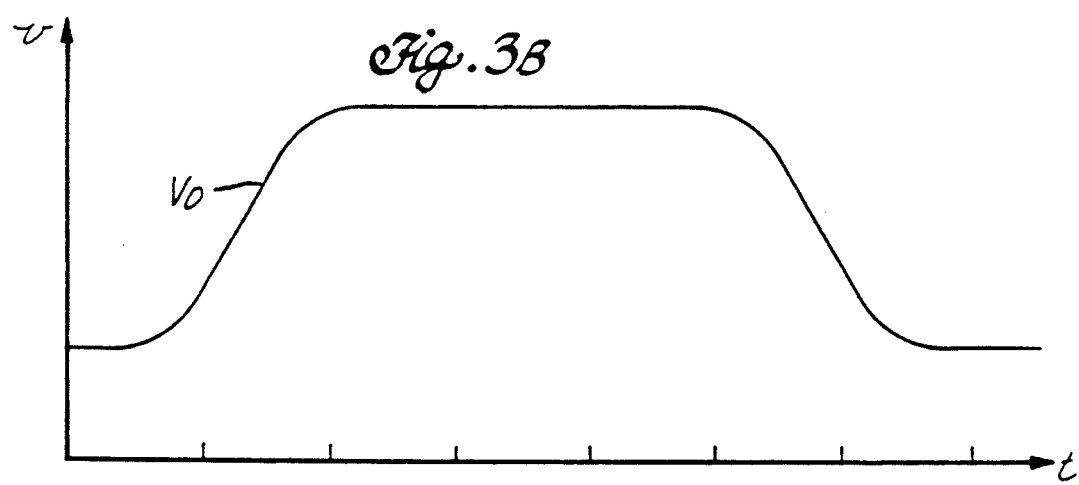
Figure 3C:
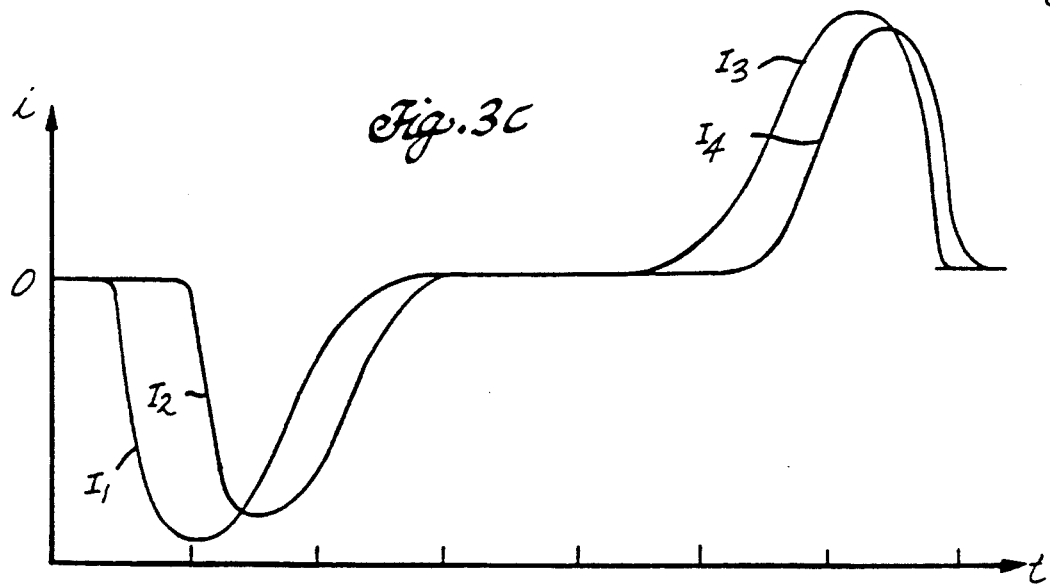
Figure 3D:
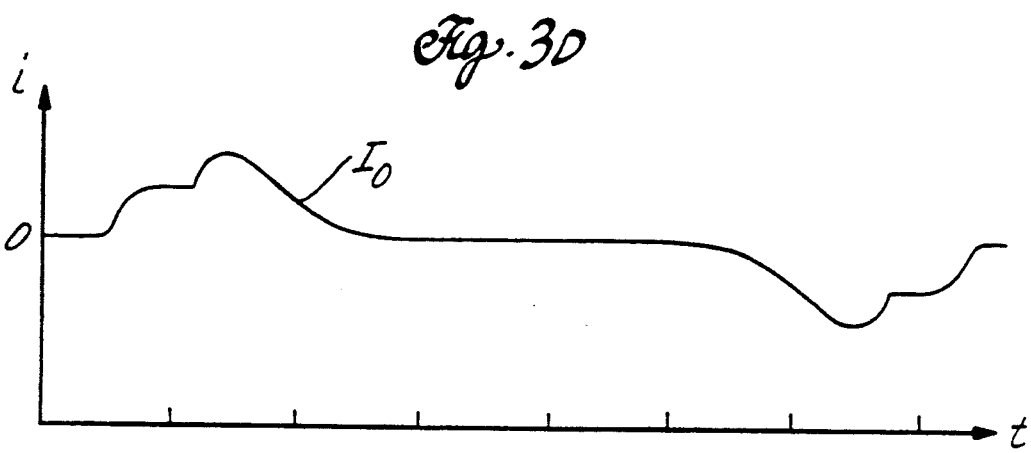
Figure 3E:
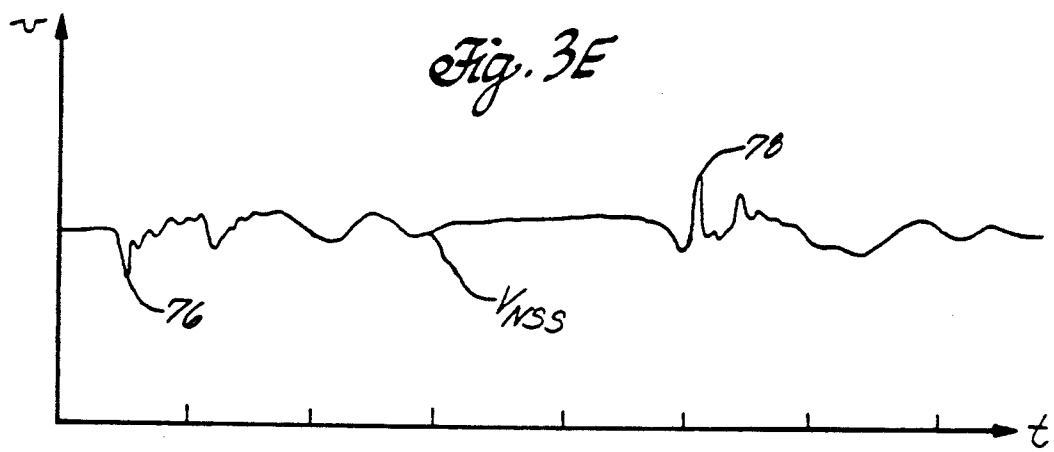
Figure 3F:
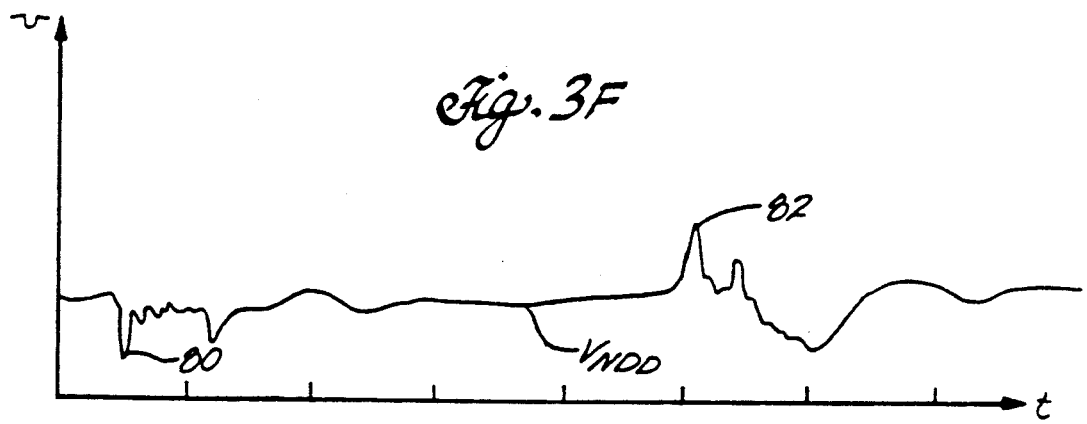

FIG. 3A represents the voltage waveform $V_I$ at the outputs of NOR gate 20 and NAND gate 22 as a function of time, as the binary data changes from low to high to low during two successive transition intervals. FIG. 3B represents the voltage waveform $V_O$ at pin 10 during the same binary data changes. In FIG. 3C, waveform $I_1$ represents the charging current supplied to load $C_1$ through transistor $P_1$, waveform $I_2$ represents the charging current supplied to load $C_1$ through transistor $P_2$, waveform $I_3$ represents the discharging current removed from load $C_1$ through transistor $N_1$, and waveform $I_4$ represents the discharging current removed from load $C_1$ through transistor $N_2$. FIG. 3D represents the total output current $I_O$ supplied to and removed from load $C_1$, i.e., the sum of currents $I_1$, $I_2$, $I_3$, and $I_4$ in FIG. 3C. FIG. 3E represents the Waveform of the noise voltage $V_{NSS}$ generated across parasitic inductance $L_{p2}$ as a result of the total output current represented by FIG. 3D. FIG. 3F represents the waveform of the noise voltage $V_{NDD}$ generated across parasitic inductance $L_{p3}$ as a result of the total output current represented in FIG. 3D. When input voltage $V_I$ goes high, current $I_1$ increases and then decreases, after transistor $P_1$ saturates. As transistor $P_1$ saturates, current $I_2$ increases, and then decreases, after transistor $P_2$ saturates. Output voltage $V_O$ at pin 10 approaches the high binary value as currents $I_1$ and $I_2$ diminish. When input voltage $V_I$ goes low, current $I_3$ increases, and then decreases, after transistor $N_I$ saturates. As transistor $N_1$ saturates, current $I_4$ increases, and then decreases, after transistor $N_2$ saturates. Output voltage $V_O$ at pin 10 approaches the low binary value as currents $I_3$ and $I_4$ diminish. FIG. 3D illustrates that, during part of the transition interval, the total output current $I_0$ is greater than the currents $I_1$, $I_2$, $I_3$ and $I_4$ passing through the individual output driver stages, i.e., transistors $P_1$, $P_2$, $N_1$, and $N_2$. To increase the total output current and thereby change the binary state of the load without increasing the transient noise voltage and/or to decrease the transient noise voltage without decreasing the total output current, more output driver stages are used. This permits current to pass through more output drive transistors at the same time. It should be noted in FIGS. 3E and 3F that the maximum noise voltage occurs as currents $I_1$ and $I_3$ are increasing; namely, at points 76, 78, 80, and 82 in FIGS. 3E and 3F, because currents $I_2$ and $I_4$ begins to increase after current $I_1$ and $I_3$ peak and start to decrease. Thus, to control the maximum noise voltage while optimizing, i.e., reducing, the load charging and discharging time, each output driver stage transistor should turn on immediately after the preceding output driver stage transistor in its succession saturates. This will ensure that the maximum transient noise voltage occurs as the first output driver stage, i.e., transistor $P_1$ or transistor $N_1$, is conducting (just after the transistor has turned on). As a result, the maximum transient noise voltage components generated by the output driver stages occur at different times in the transition interval.

In FIG. 4 an integrated circuit chip has a plurality of parallel channels comprising output drivers 84a, 84b, 84c, . . . 84n. Each output driver is the same as that shown in FIGS. 1 and 2. Binary data is coupled to output drivers 84a, 84b, 84c, . . . 84n by input terminals 16a, 16b, 16c, . . . 16n, respectively. A plus five volt power supply potential is supplied to output drives 84a, 84b, 84c, . . . 84n through pin 12 and parasitic inductance $L_{p2}$. Ground power supply potential is supplied to output drivers 84a, 84b, 84c, . . . 84d through pin 14 and parasitic conductance $L_{p3}$. Output drivers 84a, 84b, 84c, . . . 84n are connected by parasitic inductances $L_{p1a}$, $L_{p1b}$, $L_{p1c}$, . . . $L_{p1n}$, respectively, to output terminals 10a, 10b, 10c, . . . 10n, respectively. In the course of transmitting binary data to another integrated circuit chip, output drivers 84a, 84b, 84c, . . . 84n charge and discharge the capacitive loads $C_{l1}$, $C_{l2}$, $C_{l3}$, . . . $C_{ln}$, respectively, which represent the impedances of transmission lines, i.e., data buses, between integrated circuit chips.

The described embodiment of the invention is only considered to be preferred and illustrative of the inventive concept; the scope of the invention is not to be restricted to such embodiments. Various and numerous other arrangements may be devised by one skilled in the art without departing from the spirit and scope of this invention. For example, instead of sensing output voltage to enable the pull-up and pull-down predriver stages, other types of triggering circuits could be used. Current could be sensed and the enabling circuits could be actuated responsive to a current sensing circuit. This would provide greater precision in the timing of the stepwise changes in load current and, thus, greater control over the maximum transient noise voltage generated by the output driver. Alternatively, the stepwise changes in load current could be initiated as a function of time from the start of a transition in the binary value of the data signal. Specifically, an enable signal could be generated responsive to a threshold detector to which the binary input signal is applied and the enable pulse could be coupled by delay circuits to the respective enabling circuits of the pull-up and pull-down predriver stages.

What is claimed is:

1. An integrated circuit comprising:
    a plurality of parallel channels of digital circuitry;
    a plurality of connections including a first power supply pin, a second power supply pin, and a plurality of output terminals equal in number to the channels;
    a plurality of output driver circuits equal in number to the channels, each output driver having:
    a binary data input terminal;
    a plurality of first switches connected between the first power supply pin and the corresponding output terminal;
    first means as a binary signal at the input terminal changes from a first level to a second level for sequentially closing the individual first switches responsive to different voltage levels at the corresponding output terminal to increase the charging or discharging current in stepwise fashion as the corresponding output terminal is switched to the first power supply pin;
    switching means connected between the second power supply pin and the corresponding output terminal; and
    second means as a binary signal at the input terminal changes from the second level to the first level for closing the switching means to switch the corresponding output terminal to the second power supply pin.

2. The output driver circuit of claim 1, in which the switching means comprises a plurality of second switches connected between the second power supply pin and the corresponding output terminal and the second closing means comprises means for sequentially closing the individual second switches responsive to a binary signal at the input terminal changing from the second level to the first level and responsive to different voltage levels across the corresponding output terminal to increase the charging or discharging current in stepwise fashion as the corresponding output terminal is switched to the second power supply pin.

3. The output driver circuit of claim 1, in which the first power supply pin is adapted to receive a higher potential than the second power supply pin and the first switches each comprises a p-channel MOS transistor having a source to which the first power supply pin is connected, a gate to which the input terminal is connected through the first means for sequentially closing.

4. The output driver circuit of claim 2, in which the first power supply pin is adapted to receive a higher potential than the second power supply pin and the second switches each comprise an n-channel MOS transistor having a source to which the second power supply pin is connected, a gate to which the input terminal is connected through the second means for sequentially closing.

5. The output driver circuit of claim 3, in which the first means for sequentially closing the individual switches comprises a plurality of pull up predriver stages connected between the input terminal and the gates of the respective p-channel transistors, means for enabling one of the predriver stages responsive to the binary signal level at the input terminal; and means for enabling the remaining predriver stages responsive to successively larger voltage levels across the corresponding output terminal.

6. The output driver circuit of claim 2, in which the second means for sequentially closing the individual second switches comprises a plurality of pull down predriver stages connected between the input terminal and the gates of the respective n-channel transistors, means for enabling one of the predriver stages responsive to the binary signal level at the input terminal; and means for enabling the remaining predriver stages responsive to successively smaller voltage levels across the corresponding output terminal.

7. The output driver circuit of claim 5, in which the enabling means comprises an enabling circuit connected between the input terminal and the respective predriver stage and an output voltage sensing circuit connected between the corresponding output terminal and the respective enabling circuit.

8. The output driver circuit of claim 7, in which each predriver stage comprises:
- a first p-channel MOS transistor having a source to which the first power supply pin is connected, a gate to which the input terminal is connected, and a drain connected to the gate of the corresponding first switch;
- a second n-channel MOS transistor having a drain connected to the drain of the first transistor, a gate connected to its drain to operate the second transistor in saturation when conducting, and a source; and
- a third n-channel MOS transistor having a drain connected to the source of the second transistor, a gate to which the input terminal is connected, and a source to which the second power supply pin is connected.

9. The output driver circuit of claim 8, in which each enabling circuit comprises:
- a fourth p-channel MOS transistor having a source to which the first power supply pin is connected, a gate to which the voltage sensing circuit is connected, and a drain;
- a fifth n-channel MOS transistor having a drain connected to the drain of the fourth transistor and the gate of the first transistor of the corresponding predriver stage, a gate and a source connected to the second power supply pin; and
- an inverter connecting the input terminal to the gate of the fifth transistor.

10. The output driver circuit of claim 9, in which each voltage sensing circuit comprises:
- a sixth p-channel MOS transistor having a source connected to the first power supply pin, a gate to which the input terminal is connected, and a drain connected to the gate of the fourth transistor of the enabling circuit;
- a seventh n-channel MOS transistor having a drain connected to the gate of the fourth transistor and the drain of the sixth transistor, a gate connected to the corresponding output terminal, and a source, the W/L ratio of the seventh transistor being selected so the seventh transistor conducts when the corresponding output terminal is at the voltage level at which the corresponding predriver stage is enabled; and
- an eighth n-channel MOS transistor having a drain connected to the source of the seventh transistor, a gate to which the input terminal is connected, and a source connected to the second power supply pin.

11. The output driver circuit of claim 6, in which the enabling means comprises an enabling circuit connected between the input terminal and the respective predriver stage and an output voltage sensing circuit connected between the corresponding output terminal and the respective enabling circuit.

12. The output driver circuit of claim 1, in which the first means for closing for each first switch includes:
- a first p-channel MOS transistor having a source to which the first power supply pin is connected, a gate to which the input terminal is connected, and a drain connected to the gate of the corresponding first switch;
- a second n-channel MOS transistor having a drain connected to the drain of the first transistor, a gate connected to its drain to operate the second transistor in saturation when conducting, and a source; and
- a third n-channel MOS transistor having a drain connected to the source of the second transistor, a gate to which the input terminal is connected, and a source to which the second power supply pin is connected.

* * * * *